United States Patent
Hirose et al.

(10) Patent No.: US 10,461,752 B2
(45) Date of Patent: Oct. 29, 2019

(54) TEMPERATURE CONTROLLING APPARATUS AND OSCILLATION APPARATUS

(71) Applicant: Asahi Kasei Microdevices Corporation, Tokyo (JP)

(72) Inventors: Hideaki Hirose, Tokyo (JP); Takayuki Sato, Tokyo (JP); Kenji Suzuki, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/904,451

(22) Filed: Feb. 26, 2018

(65) Prior Publication Data

US 2018/0278256 A1    Sep. 27, 2018

(30) Foreign Application Priority Data

Mar. 27, 2017    (JP) .................................. 2017-061975

(51) Int. Cl.
| | |
|---|---|
| *H03B 5/04* | (2006.01) |
| *H03L 1/04* | (2006.01) |
| *H03B 1/02* | (2006.01) |
| *H03L 1/02* | (2006.01) |

(52) U.S. Cl.
CPC ................ *H03L 1/04* (2013.01); *H03B 1/02* (2013.01); *H03L 1/022* (2013.01)

(58) Field of Classification Search
CPC ...................................................... H03B 5/04
USPC ................................................... 331/70, 176
See application file for complete search history.

(56) References Cited

U.S. PATENT DOCUMENTS

| | | | |
|---|---|---|---|
| 2006/0192626 A1 | 8/2006 | Milliren | |
| 2008/0055011 A1* | 3/2008 | Kasahara | H03L 1/04 331/70 |
| 2010/0052801 A1* | 3/2010 | Koyama | G05D 23/1906 331/69 |
| 2013/0008883 A1 | 1/2013 | Arai | |
| 2015/0180444 A1 | 6/2015 | Hayashi et al. | |
| 2016/0285460 A1 | 9/2016 | Chiang et al. | |

FOREIGN PATENT DOCUMENTS

| | | |
|---|---|---|
| JP | 2005-175703 A | 6/2005 |
| JP | 2011-091702 A | 5/2011 |
| JP | 2015-173315 A | 10/2015 |

* cited by examiner

*Primary Examiner* — Joseph Chang

(57) ABSTRACT

It is desired to even further attempt to stabilize temperature in oscillator such as OCXOs (Oven Controlled Crystal Oscillators). A temperature controlling apparatus is provided. The temperature controlling apparatus includes: a temperature sensor; a power supply circuit that supplies, to a first heater, power corresponding to a difference between a target value and a detected value obtained from the temperature sensor; and a second heater that is provided at a position such that thermal conduction therefrom to the temperature sensor is faster than that from the power supply circuit, and changes power consumption of the second heater according to power consumption of the power supply circuit.

12 Claims, 13 Drawing Sheets

TEMPERATURE CONTROLLING APPARATUS AND OSCILLATION APPARATUS

The contents of the following Japanese patent application(s) are incorporated herein by reference:
NO. 2017-061975 filed on Mar. 27, 2017.

BACKGROUND

1. Technical Field

The present invention relates to a temperature controlling apparatus and an oscillation apparatus.

2. Related Art

An oscillator using a crystal blank or the like has an oscillation frequency that varies depending on temperature. Because of this, there is an OCXO (Oven Controlled Crystal Oscillator) that keeps temperature constant by incorporating a heat source in the oscillator (please see Patent Document 1, for example). Because the OCXO attains approximately constant temperature of a crystal blank even if the ambient temperature varies, it can keep the oscillation frequency constant, independent of the temperature characteristic of the crystal blank. Accordingly, OCXOs are in some cases used to generate reference clocks of communication infrastructures (backbone networks, wireless base stations, etc.) that require stricter frequency accuracy than that of TCXOs (Temperature Compensated Crystal Oscillators).

Patent Document 1: Specification of United States Patent Application Publication No. 2016/0285460

It is desired to even further attempt to stabilize temperature in oscillators such as OCXOs like the one explained above.

SUMMARY

Therefore, it is an object of an aspect of the innovations herein to provide a temperature controlling apparatus and an oscillation apparatus, which are capable of overcoming the above drawbacks accompanying the related art. The above and other objects can be achieved by combinations described in the claims. A first aspect of the present invention provides a temperature controlling apparatus including: a temperature sensor; a power supply circuit that supplies, to a first heater, power corresponding to a difference between a target value and a detected value obtained from the temperature sensor; and a second heater that is provided at a position such that thermal conduction therefrom to the temperature sensor is faster than that from the power supply circuit, and changes power consumption of the second heater according to power consumption of the power supply circuit.

A second aspect of the present invention provides an oscillation apparatus including: the temperature controlling apparatus according to the first aspect; and an oscillation circuit controlled to be at a target temperature by the temperature controlling apparatus.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiments do not limit the invention according to the claims, and all the combinations of the features described in the embodiments are not necessarily essential to means provided by aspects of the invention.

Figure 1:
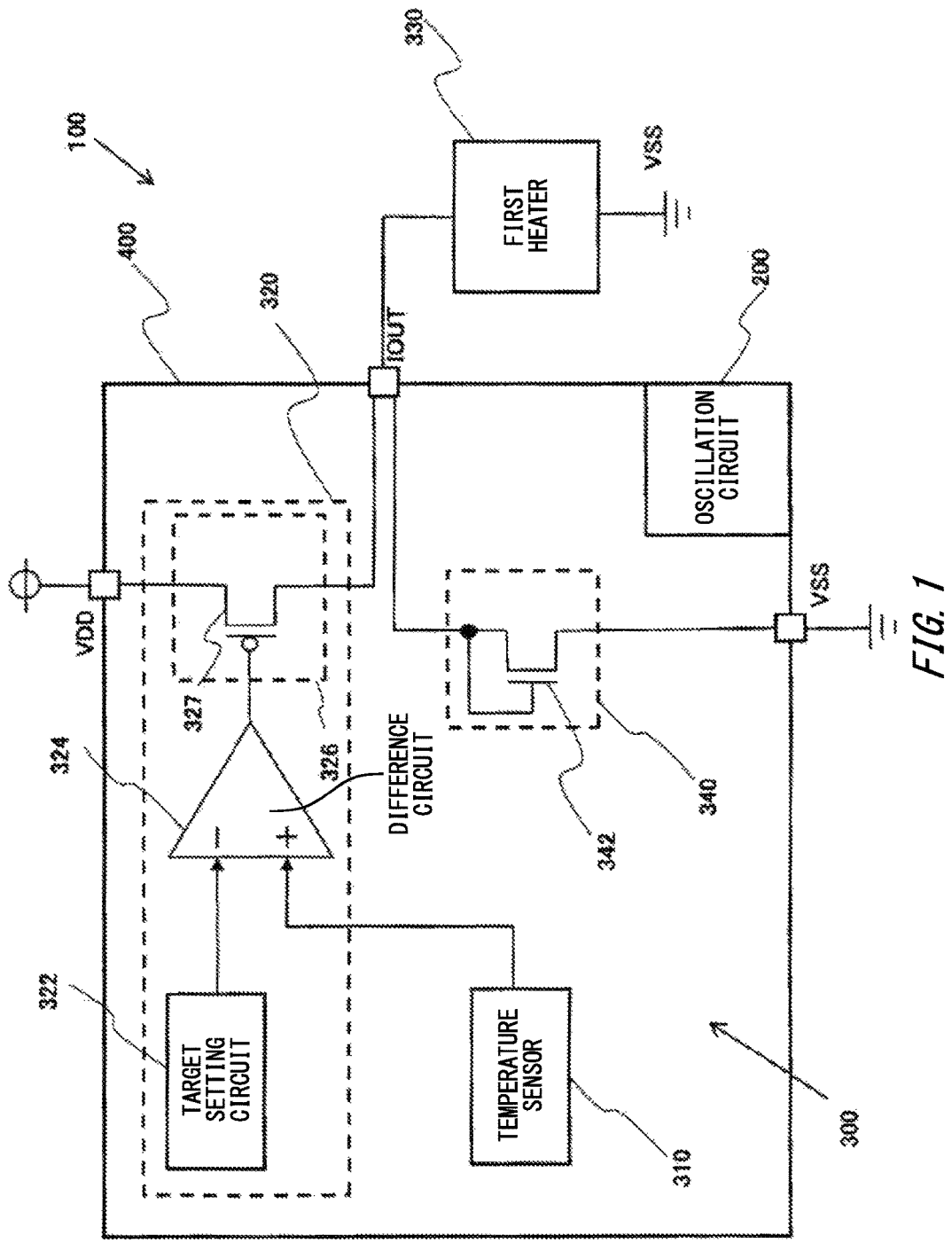
FIG. 1 shows a first configuration example of an oscillation apparatus 100 according to the present embodiment.

FIG. 1 shows a first configuration example of an oscillation apparatus 100 according to the present embodiment. The oscillation apparatus 100 includes an oscillation circuit 200 and a temperature controlling apparatus 300. The oscillation apparatus 100 controls, by means of the temperature controlling apparatus 300, the oscillation circuit 200 to be at a target temperature, and oscillates the oscillation circuit 200 at a predetermined target oscillation frequency. The oscillation apparatus 100 is an OCXO (Oven Controlled Crystal Oscillator), as one example.

The oscillation circuit 200 oscillates a resonator by supplying oscillation energy, and outputs, to the outside, an oscillation frequency signal. The oscillation circuit 200 may have a resonator connected outside an integrated circuit 400, and the resonator may be provided with a crystal blank or the like between two electrodes. The oscillation frequency of the oscillation circuit 200 may vary according to the temperature of the oscillation circuit 200.

The temperature controlling apparatus 300 controls the oscillation circuit 200 to be at a target temperature, and adjusts variation in the oscillation frequency of the oscillation circuit 200. The temperature controlling apparatus 300 has a temperature sensor 310, a power supply circuit 320, a first heater 330 and a second heater 340.

The temperature sensor 310 may detect the internal temperature of the oscillation apparatus 100, the temperature of the oscillation circuit 200 or the temperature of the first heater 330, and output a sense voltage corresponding to the detected value. The temperature sensor 310 may detect the temperature around a crystal blank of the oscillation circuit 200 or the first heater 330, for example. The temperature sensor 310 may be a temperature sensor device incorporated into the integrated circuit 400, and may be a diode, for example.

The power supply circuit 320 is connected to the temperature sensor 310, and outputs power corresponding to the difference between the detected value obtained from the temperature sensor 310 and a target value. The power supply circuit 320 has a target setting circuit 322, a difference circuit 324 and a current output circuit 326.

The target setting circuit 322 outputs a target value corresponding to a target temperature. The target setting circuit 322 can set the target temperature of the oscillation circuit 200 at the time of factory shipment or according to a user input, for example, and outputs a voltage or current corresponding to the target temperature.

The difference circuit 324 may have a negative input connected to the target setting circuit 322 and a positive input connected to the temperature sensor 310. The difference circuit 324 may amplify and output the difference between the target value obtained from the target setting circuit 322 and the detected value obtained from the temperature sensor 310. The difference circuit 324 may be a differential amplifier circuit, as one example.

The current output circuit 326 may have a first transistor 327, and the first transistor 327 may have the gate connected to an output of the difference circuit 324, and the source and drain respectively connected between a power source potential VDD, and the first heater 330 and the second heater 340. The current output circuit 326 outputs, to the first heater 330 and the second heater 340, current corresponding to an output of the difference circuit 324. The current output circuit 326 may increase output current if detected temperature is lower than the target temperature, and decrease output current if detected temperature is higher than target temperature. The first transistor 327 may be a bipolar transistor, a power MOSFET or a power transistor such as an IGBT, for example.

The first heater 330 is connected between an output of the current output circuit 326 and a reference potential, and is supplied, from the current output circuit 326, with power corresponding to the difference between the detected value obtained from the temperature sensor 310 and the target value. The reference potential may be a ground potential VSS, for example. The first heater 330 is arranged near the oscillation circuit 200, and for example is arranged very close to a resonator of the oscillation circuit 200 or is arranged such that a plurality of the first heaters 330 sandwich a resonator. The first heater 330 may consume power from the current output circuit 326 to generate heat, thereby controlling the oscillation circuit 200 to be at the target temperature. The first heater 330 may be any heater as long as it generates heat by current being flowing therethrough, and may have a transistor such as an NMOS transistor or a PMOS transistor, for example. Also, the first heater 330 may be a metal wire or the like such as a nichrome wire. The first heater 330 may not be included in the temperature controlling apparatus 300.

The second heater 340 is connected between an output of the current output circuit 326 and a reference potential, and connected to the power supply circuit 320 in parallel with the first heater 330. The second heater 340 is provided at a position such that thermal conduction therefrom to the temperature sensor 310 is faster than that from the power supply circuit 320, and changes power consumption of the second heater 340 according to power consumption of the power supply circuit 320. The second heater 340 consumes power according to the difference between the detected value obtained from the temperature sensor 310 and the target value, and generates heat. The second heater 340 has a second transistor 342 that has: the drain and source that are connected between an output of the current output circuit 326 and a reference potential; and the gate connected on the side of the output of the current output circuit 326. The second transistor 342 may be a MOS transistor, a bipolar transistor or the like. If the second transistor 342 is a bipolar transistor, the emitter, collector and base are connected corresponding to the source, drain and gate. As one example, in the oscillation apparatus 100 of the first configuration example, the second transistor 342 is an NMOS transistor, and in this case, the reference potential is the ground potential VSS.

The oscillation apparatus 100 of the present embodiment can suppress, by means of the second heater 340, thermal hunting (thermal oscillation) in which heat-generation of the current output circuit 326 is inevitably detected by the temperature sensor 310. Also, because suppression of thermal hunting is realized only by adding the second heater 340 constituted by one type of transistor or the like, the area for the second heater 340 does not require much space, and wiring also can be minimized because complicated wire connections are not necessary. Also, the oscillation apparatus 100 requires no more than a solid ground pattern with a single wire allowing large current to flow through the first heater 330 and the second heater 340. As a result of this, it is possible to prevent heat from escaping, which may result in unstable heat control, as observed if extra and excessive conductivity patterns are prepared, and heat control becomes more stable.

Figure 2:
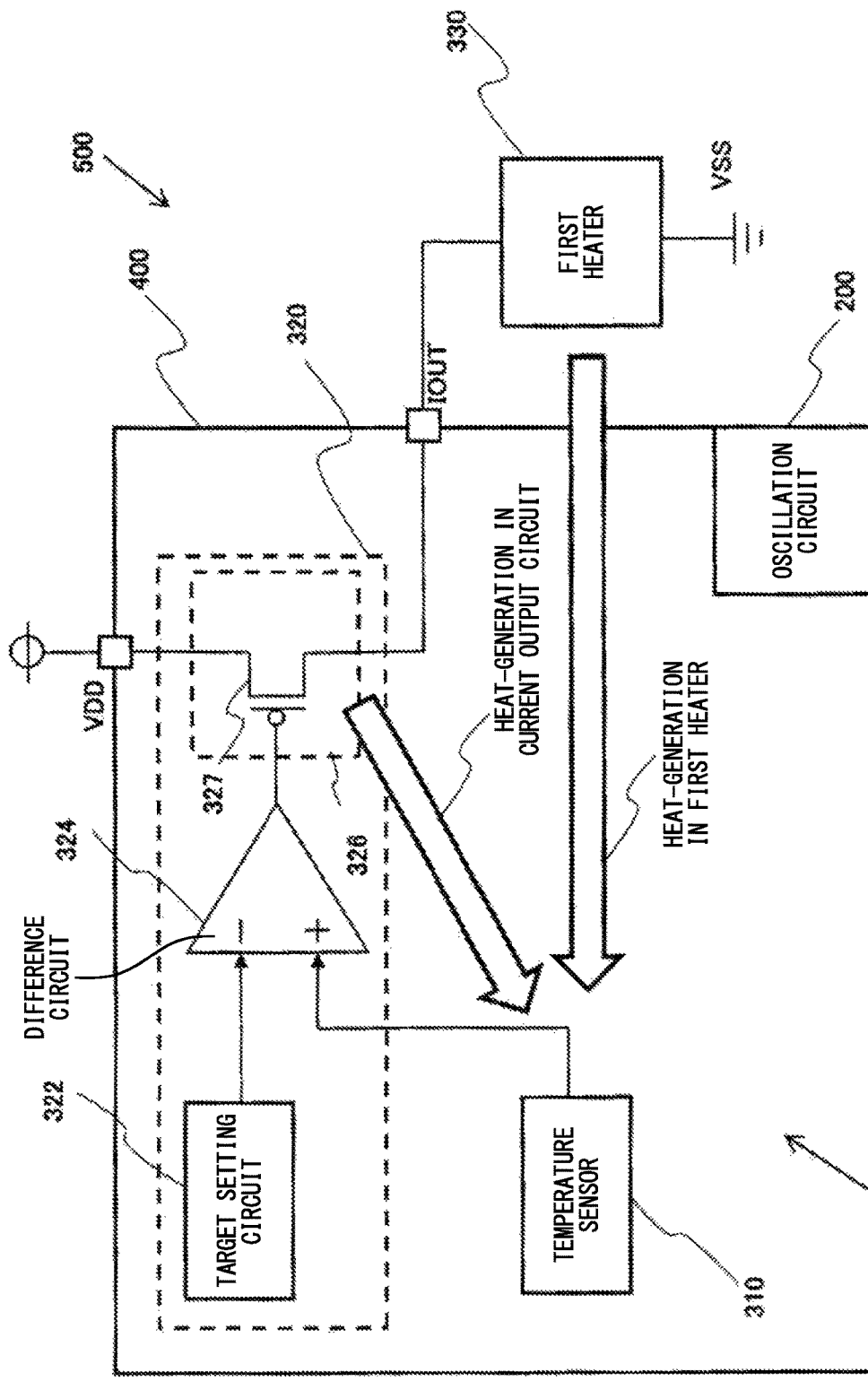
FIG. 2 shows an oscillation apparatus 500 of a comparative example.

Here, thermal hunting is explained in detail. FIG. 2 shows an oscillation apparatus 500 of a comparative example. The oscillation apparatus 500 of the comparative example does not include the second heater 340 in the oscillation apparatus 100 of the present embodiment.

First, because the first transistor 327 supplies current to flow through the first heater 330, the first transistor 327 itself generates heat. Accordingly, as shown in FIG. 2, the temperature sensor 310 receives heat from the first transistor 327 and heat from the first heater 330. Here, if temperature detected by the temperature sensor 310 is low, in order to raise the temperature of the first heater 330, the power supply circuit 320 increases current to flow through the first transistor 327, and increases current to flow through the first heater 330. At this time, in the region indicated with broken lines A in FIG. 4, current of the first transistor 327 increases, but the inter-source-drain voltage of the first transistor (the inter-emitter-collector voltage in the case of a bipolar transistor) lowers; therefore, the power consumption of the first transistor 327 decreases, and the amount of heat to be transferred from the first transistor 327 to the temperature sensor 310 decreases. Because as a result of this, the amount of heat that the temperature sensor 310 receives from the first transistor 327 decreases before the amount of heat that the temperature sensor 310 receives from the first heater 330 increases, the temperature sensor 310 might detect a temperature fall at least temporarily. Accordingly, if in the temperature controlling apparatus 300, the amount of current to flow through the first transistor 327 is increased to raise the temperature, a positive feedback occurs in which the temperature detected by the temperature sensor 310 lowers, and furthermore current to flow through the first transistor 327 is inevitably increased.

Specifically, it is assumed that in the oscillation apparatus 500 of the comparative example, the power source voltage is Vdd [V], the voltage of the output terminal IOUT of the current output circuit 326 is Vo [V], the amount of output current that flows through the current output circuit 326 and the first heater 330 is Io [A], and the resistance of the first heater 330 is Rh [Ω]. In this case, the voltage Vo of the output terminal IOUT is expressed by the equation Vo=Rh×Io. Also, the power Pt [W] and Ph [W] consumed by the current output circuit 326 and the first heater 330 are expressed as follows:

$$Pt=Io(Vdd-Vo)=Io(Vdd-Rh\times Io) \quad \text{(Equation 1)}$$

$$Ph=Vo\times Io=Rh\times Io^2 \quad \text{(Equation 2)}$$

Accordingly, the internal temperature Ti [° C.] of the oscillation apparatus 500 when it is heated by the output current Io is expressed as follows if it is assumed that the package thermal resistance (the thermal resistance between the integrated circuit 400 and the first heater 330, and the outside air) of the oscillation apparatus 500 is θa [° C./W], and the ambient temperature is Ta [° C.]. It is assumed that temperature increase of the integrated circuit 400 all approximates the one due to current Io.

$$Ti=Ta+\theta a(Pt+Ph)=Ta+\theta a\times Io\times Vdd \quad \text{(Equation 3)}$$

Figure 3:
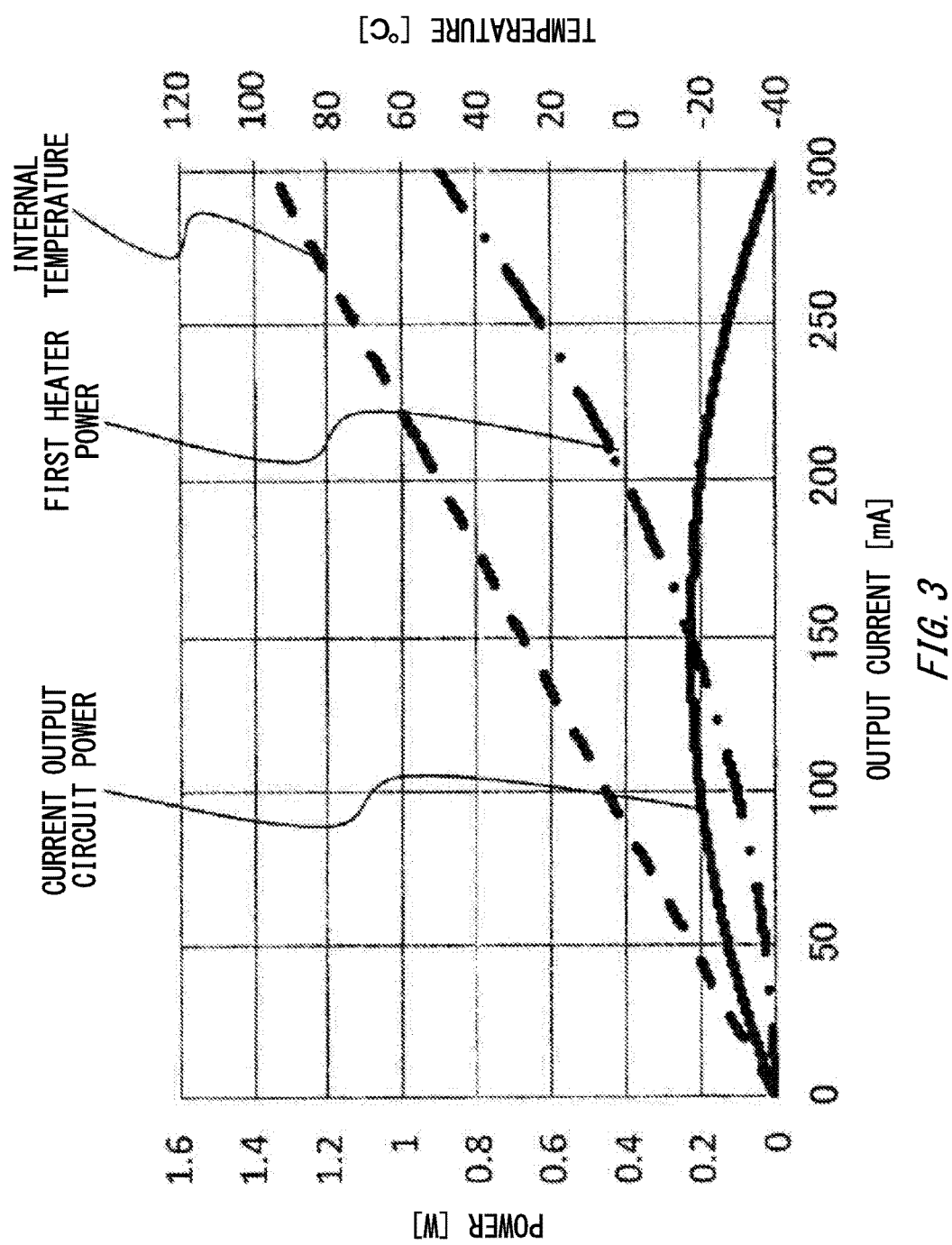
FIG. 3 shows internal temperature of the oscillation apparatus 500, power of a current output circuit 326, and power of a first heater 330 in relation to output current of a current output circuit 326.
Figure 4:
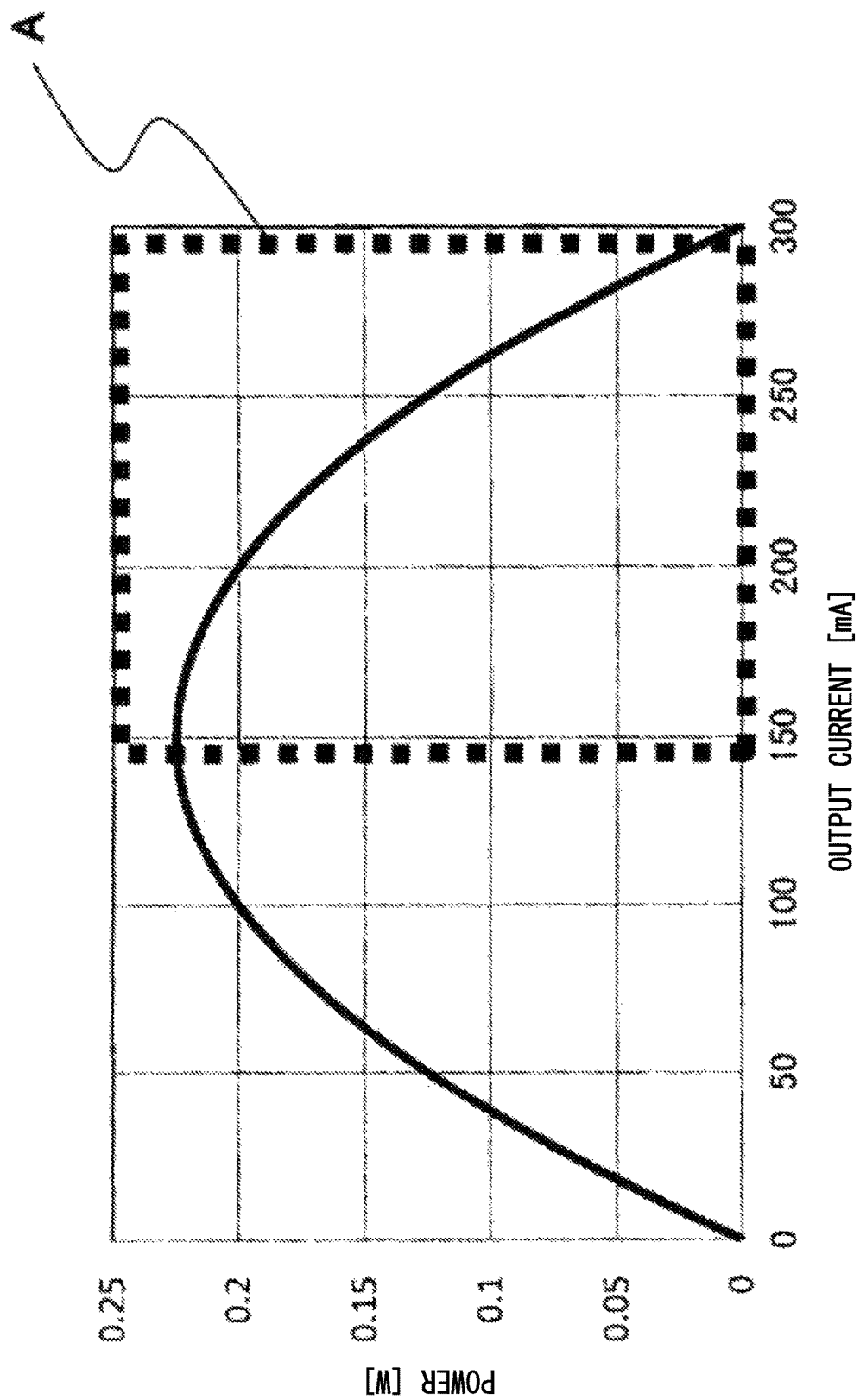
FIG. 4 shows power of the current output circuit 326 in relation to output current of the current output circuit 326.

As a specific example, it is assumed that in the oscillation apparatus 500 of the comparative example, Vdd=3 V, Rh=10Ω, θa=150° C./W and Ta=−40° C. FIG. 3 shows internal temperature [° C.] of the oscillation apparatus 500, power consumption Pt [W] of the current output circuit 326, and power consumption Ph [W] of the first heater 330 in relation to output current of the current output circuit 326. FIG. 4 shows power consumption Pt [W] of the current output circuit 326.

As shown in FIGS. 3 and 4, along with increase in the output current, the internal temperature and the power consumption of the first heater 330 increase, but the region A of a negative slope (the range where output current is 150 to 300 mA in FIGS. 3 and 4) occurs to the power consumption of the current output circuit 326. The region A is one of causes of thermal hunting. The region A shown in FIG. 4 shows that if output current of the current output circuit 326 is increased to heat the oscillation circuit 200, heat-generation of the current output circuit 326 decreases. This shows that, neglecting heat-generation of the first heater 330 outside the package of the integrated circuit 400 and considering only the current output circuit 326, the thermal feedback loop system becomes a positive feedback.

Also, a second cause of thermal hunting is that the speed of thermal conduction to the temperature sensor 310 is slower for the first heater 330 than for the current output circuit 326.

As shown in FIG. 2, the first heater 330 is connected outside, a substrate and the like are arranged in a thermal conduction path to the temperature sensor 310, and this inhibits thermal conduction from the first heater 330 to the temperature sensor 310. Therefore, it takes time for heat to reach from the first heater 330 to the temperature sensor 310. On the other hand, because the thermal conduction path from the current output circuit 326 to the temperature sensor 310 is thermal conduction within the single integrated circuit 400, the thermal conduction is fast. The stability of the thermal feedback loop system in such an oscillation apparatus 500 is shown using an AC analysis simulation result using specific numerical values.

Respective simulation conditions are as follows: the power source voltage Vdd=3 V; the resistance Rh of the first heater 330=10Ω; the package thermal resistance θa of the oscillation apparatus 500=150° C./W, the ambient temperature Ta=−40° C.; and the output current Io=200 mA. The conditions are equivalent to conditions where thermal hunting occurs (region A) in FIG. 4. In this case, the internal temperature of the oscillation apparatus 500 is:

$$Ti=-40°\text{ C.}+150°\text{ C./W}\times(3V\times200\text{ mA})=50°\text{ C.}$$

Figure 5:
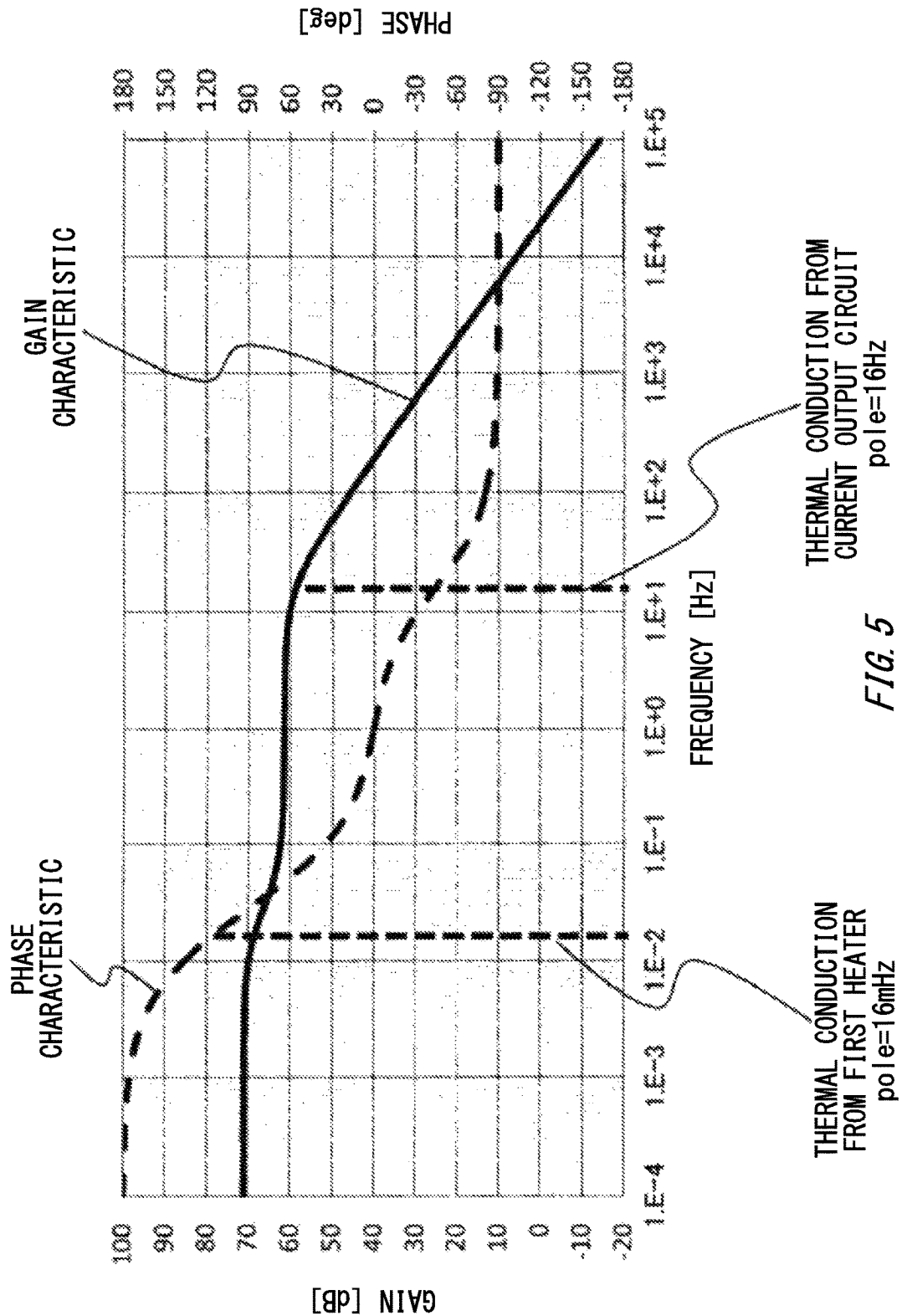
FIG. 5 shows an open-loop gain characteristic and phase characteristic of a thermal feedback loop.

Furthermore, in addition to these conditions, it is assumed about the time constants of thermal conduction that the thermal conduction time constant of thermal conduction from the current output circuit 326 to the temperature sensor 310 is τt=10 ms, and the thermal conduction time constant of thermal conduction from the first heater 330 to the temperature sensor 310 is τh=10 s. Also, parameters of the temperature controlling apparatus 300 are as follows: the gain of the temperature sensor 310=10 mV/° C. (positive temperature characteristic); the gain of the difference circuit 324=60 dB; and the transconductance gm of the current output circuit 326=800 mA/V. In the oscillation apparatus 500, a thermal feedback loop, output of the temperature sensor 310→control of the current output circuit 326→change in the output current Io→detection by the temperature sensor 310→output of the temperature sensor 310→ . . . , is formed. FIG. 5 shows an open-loop gain characteristic and phase characteristic of the thermal feedback loop.

As shown in FIG. 5, the gain characteristic has two poles. The first pole corresponds to the thermal conduction time constant=10 s of thermal conduction from the first heater 330, and is observed at the frequency 16 mHz (=1/(2π+10 s)). The second pole corresponds to the thermal conduction time constant=10 ms of thermal conduction from the current output circuit 326, and is observed at the frequency 16 Hz (=1/(2π×10 ms)). In FIG. 5, the phase of frequency where gain=0 dB is −90 deg. That is, the phase margin is −90 deg, and this indicates that thermal hunting occurs.

Here, normally, the phase lag caused by one pole is 90°. However, the phase lag due to pole=16 mHz of FIG. 5 is not 90° but 180°. This is because about frequency components exceeding 16 mHz, the gain of a negative feedback path from the first heater 330 to the temperature sensor 310 decreases, and then the positive feedback path from the current output circuit 326 to the temperature sensor 310 becomes dominant. Because the negative feedback for DC frequency turns the positive feedback after 16 mHz, this is equivalent to the phase being lagged by 180° (=the polarity reverses).

Under the above-mentioned conditions, a transient response simulation of output current and internal temperature was performed.

Figure 6:
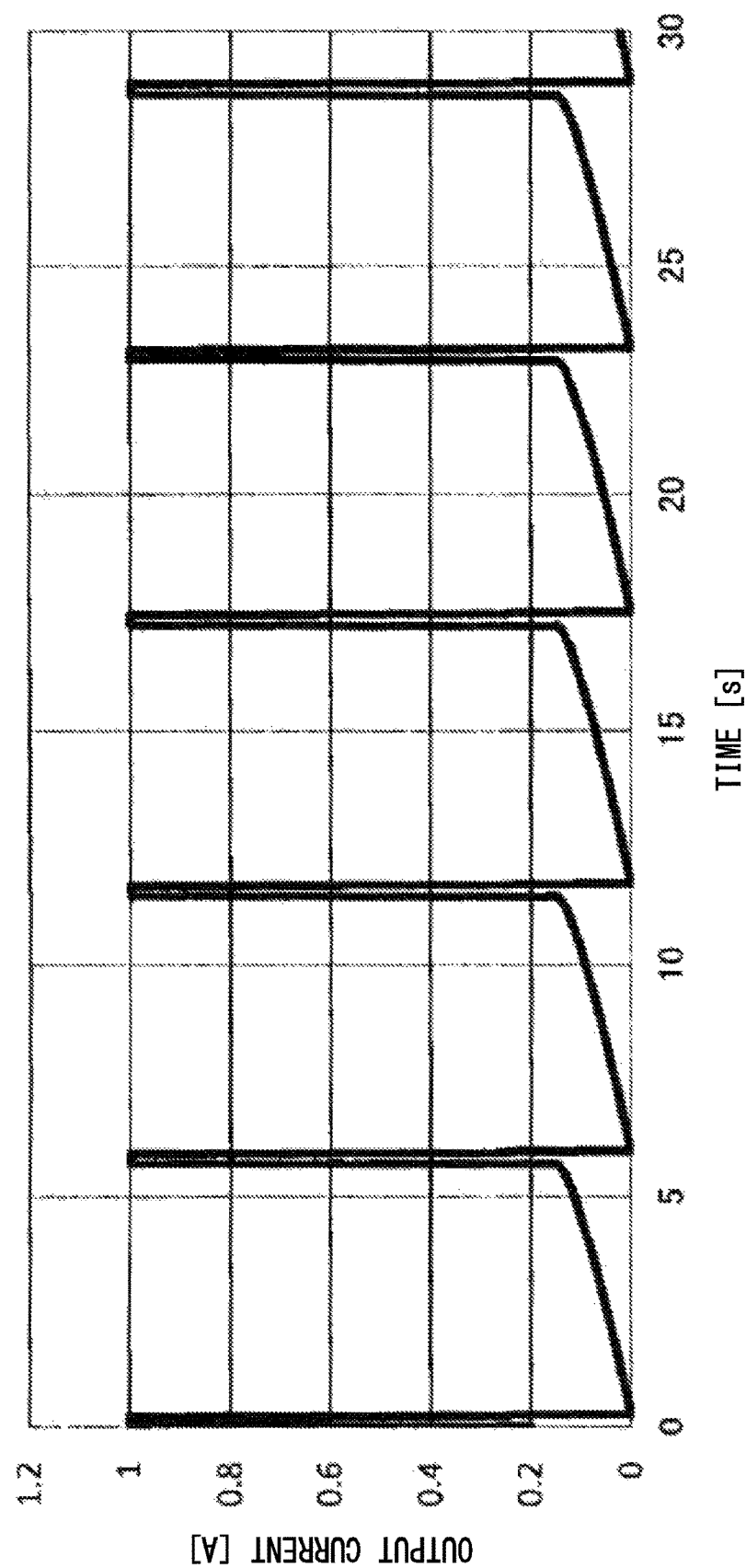
FIG. 6 shows a transient response simulation result of output current of the current output circuit 326.
Figure 7:
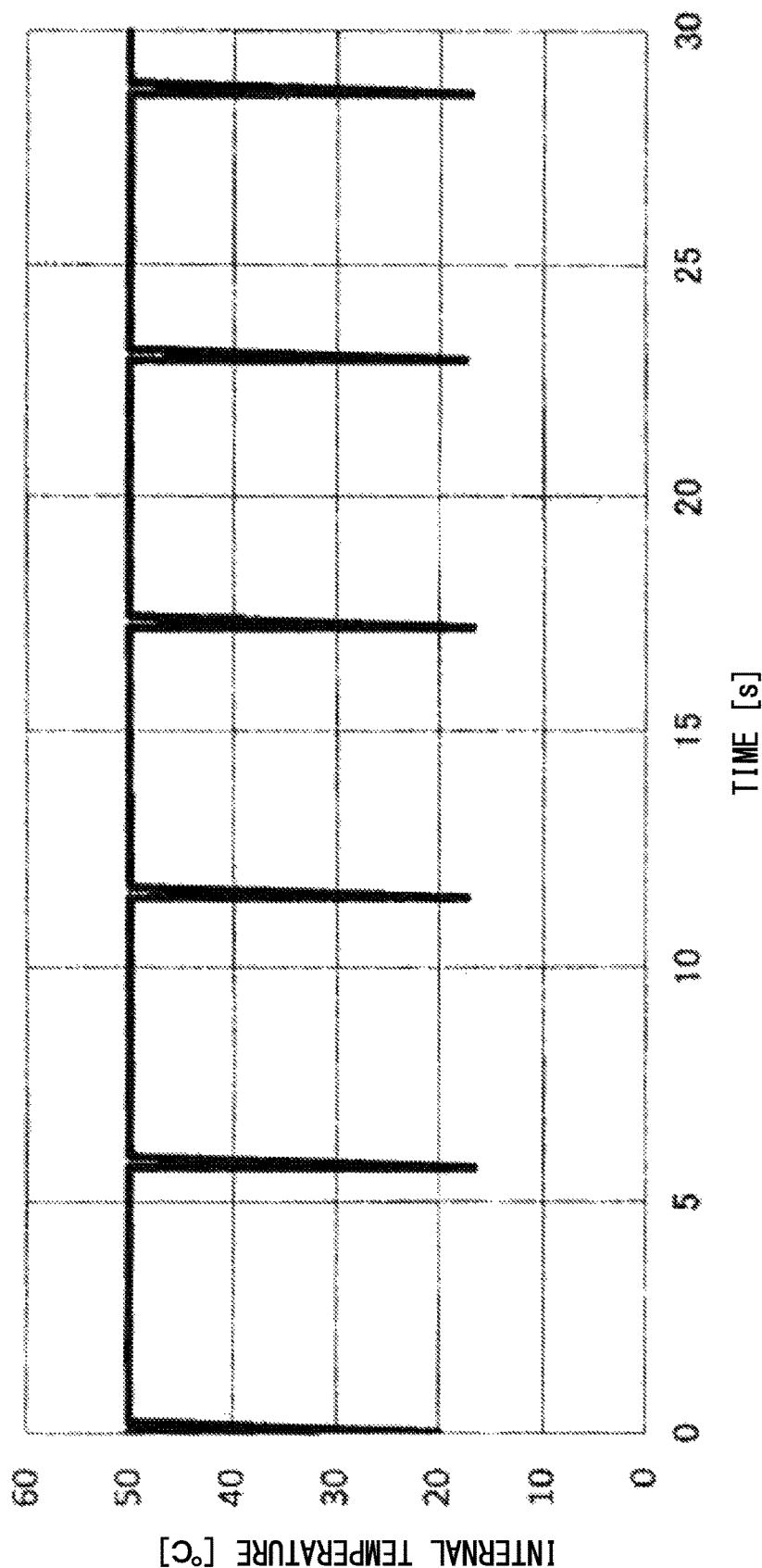
FIG. 7 shows a transient response simulation result of internal temperature of the oscillation apparatus 100.

FIG. 6 shows a transient response simulation result of output current of the current output circuit 326. FIG. 7 shows a transient response simulation result of internal temperature of the oscillation apparatus 500. At the time of the simulation, the upper limit of output current of the current output circuit 326 was set to 1 A. As shown in FIGS. 6 and 7, it can be seen that both output current and internal temperature did not stabilize, and thermal hunting occurred. In the thermal hunting, the current output circuit 326 shows a behavior of periodically switching ON/OFF.

As a reference, the gain characteristic and phase characteristic in a case where the respective conditions are as follows were investigated: the power source voltage Vdd=3 V; the resistance Rh of the first heater 330=10Ω; the package thermal resistance θa of the oscillation apparatus 500=150° C./W, the ambient temperature Ta=−40° C.; and the output current Io=100 mA. In this case, the internal temperature of the oscillation apparatus 500 is:

$$Ti=-40°\ C.+150°\ C./W\times(3V\times100\ mA)=5°\ C.$$

The condition of Io=100 mA is a region where thermal hunting does not occur (a region outside the region A) in FIG. 4.

Figure 8:
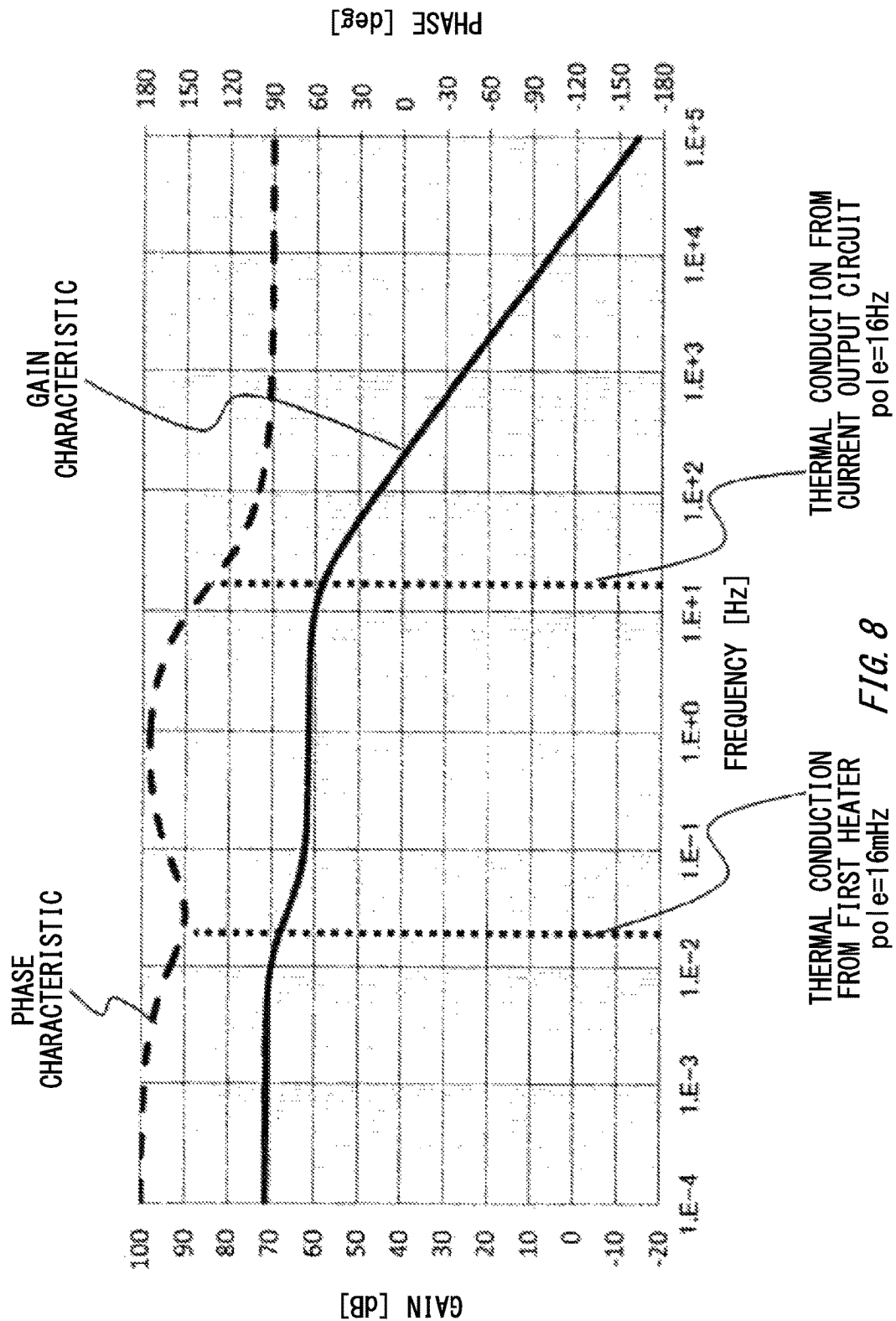
FIG. 8 shows an open-loop gain characteristic and phase characteristic of a thermal feedback loop.

FIG. 8 shows an open-loop gain characteristic and phase characteristic of a thermal feedback loop under the reference conditions. In FIG. 8, the phase margin is 90 deg, and this indicates that the system is stable. Also, in FIG. 8, change from a negative feedback to a positive feedback (180°−phase lag) at pole=16 mHz did not occur either.

Figure 9:
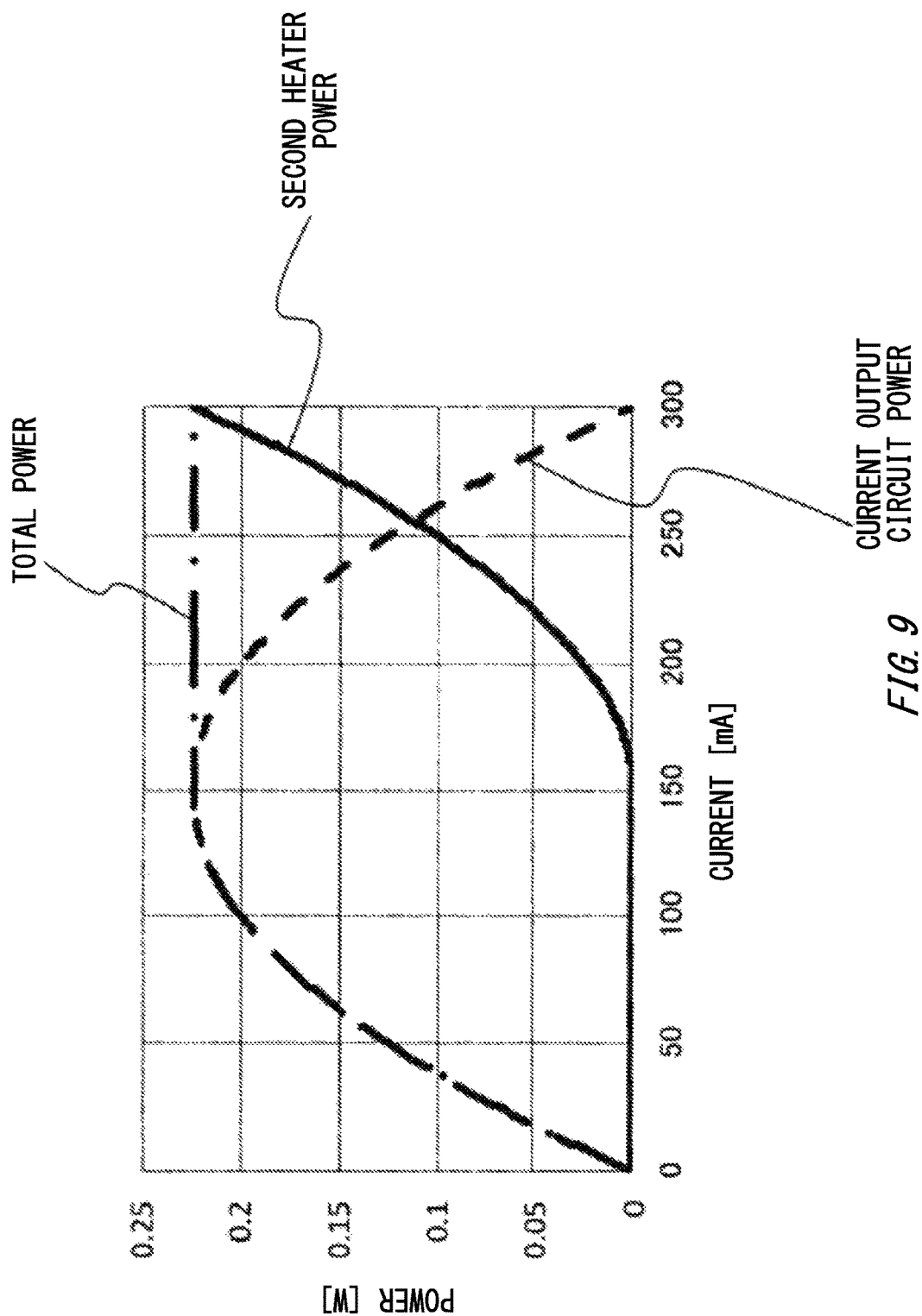
FIG. 9 shows power of the current output circuit 326, power of a second heater 340 and the total power in relation to output current of the current output circuit 326 in the oscillation apparatus 100 of the present embodiment.

Here, in the oscillation apparatus 100 of the present embodiment shown in FIG. 1, the second heater 340 can attain a thermal feedback which is a negative feedback and improve the temperature stability by compensating change in power consumption corresponding to decrease in power of the current output circuit 326 of the power supply circuit 320. For example, if the power supply circuit 320 increases power supplied to the first heater 330, and power consumption of the power supply circuit 320 decreases, the second heater 340 preferably keeps constant or increases (un-decreases) the total power consumption of the power supply circuit 320 and the second heater 340. FIG. 9 shows power of the current output circuit 326, power of the second heater 340, and their total power in the oscillation apparatus 100 of the present embodiment. As shown in FIG. 9, by compensating, with the power of the second heater 340, the region of the power of the current output circuit 326 after the peak and where the slope becomes negative, the slope of the total power can be made positive or zero after the peak. Thereby, it is possible to prevent the power of the current output circuit 326 from decreasing irrespective of the output current being increased and to prevent the thermal feedback from inevitably turning a positive feedback, which are causes of thermal hunting.

In the oscillation apparatus 100 according to the present embodiment in FIG. 1, the temperature sensor 310, the power supply circuit 320, the second heater 340 and the oscillation circuit 200 may be provided in the single integrated circuit 400, and the first heater 330 may be connected outside the integrated circuit 400. Because thermal conduction time constant also affects temperature stability, in comparison with thermal conduction from the current output circuit 326, thermal conduction from the second heater 340 preferably reaches the temperature sensor 310 simultaneously or faster, for the sake of temperature stabilization. Because the temperature sensor 310, the power supply circuit 320 and the second heater 340 provided in the single integrated circuit 400 are linked in a single substrate, thermal conduction time constants of the second heater 340 and the power supply circuit 320 become approximately the same. Also, in terms of thermal conduction time constant, the second heater 340 is more preferably arranged closer to the temperature sensor 310 than the power supply circuit 320 is. The integrated circuit 400 may be an LSI, a multi-chip module, or the like.

Here, operation of the oscillation apparatus 100 of the present embodiment is as follows: according to detected temperature of the temperature sensor 310, current of the current output circuit 326 increases, voltage of the output terminal IOUT rises, gate voltage of the second heater 340 rises, the amount of current from the drain of the second heater 340 to its source increases, and the amount of heat generation of the second heater 340 increases. That is, according to increase in current of the current output circuit 326, the amount of heat generation of the second heater 340 also increases. Therefore, by appropriately selecting parameters, it is possible to make the slope of the total power of the current output circuit 326 and the second heater 340 always positive in relation to increase in current of the current output circuit 326. In the following, one example of parameters for making the slope of the total power positive is shown with a simulation result using the oscillation apparatus 100 of the present embodiment.

The conditions of the oscillation apparatus 100 are as follows: the power source voltage Vdd=3 V; the resistance Rh of the first heater 330=10Ω; the package thermal resistance θa of the oscillation apparatus 100=150° C./W; the ambient temperature Ta=−40; the thermal conduction time constant τt of thermal conduction from the current output circuit 326 to the temperature sensor 310=10 ms; the thermal conduction time constant τnd of thermal conduction from the second heater 340 to the temperature sensor 310=10 ms; the thermal conduction time constant τh of thermal conduction from the first heater 330 to the temperature sensor 310=10 s; the gain of the temperature sensor 310=10 mV/° C. (positive temperature characteristic); the gain of the difference circuit 324=60 dB; the transconductance gm of the first transistor 327 of the current output circuit 326=800 mA/V; and the threshold Vth of the second transistor 342 of the second heater 340=0.65 V.

The results of simulation under these conditions are shown in FIGS. 10 to 13.

Figure 10:
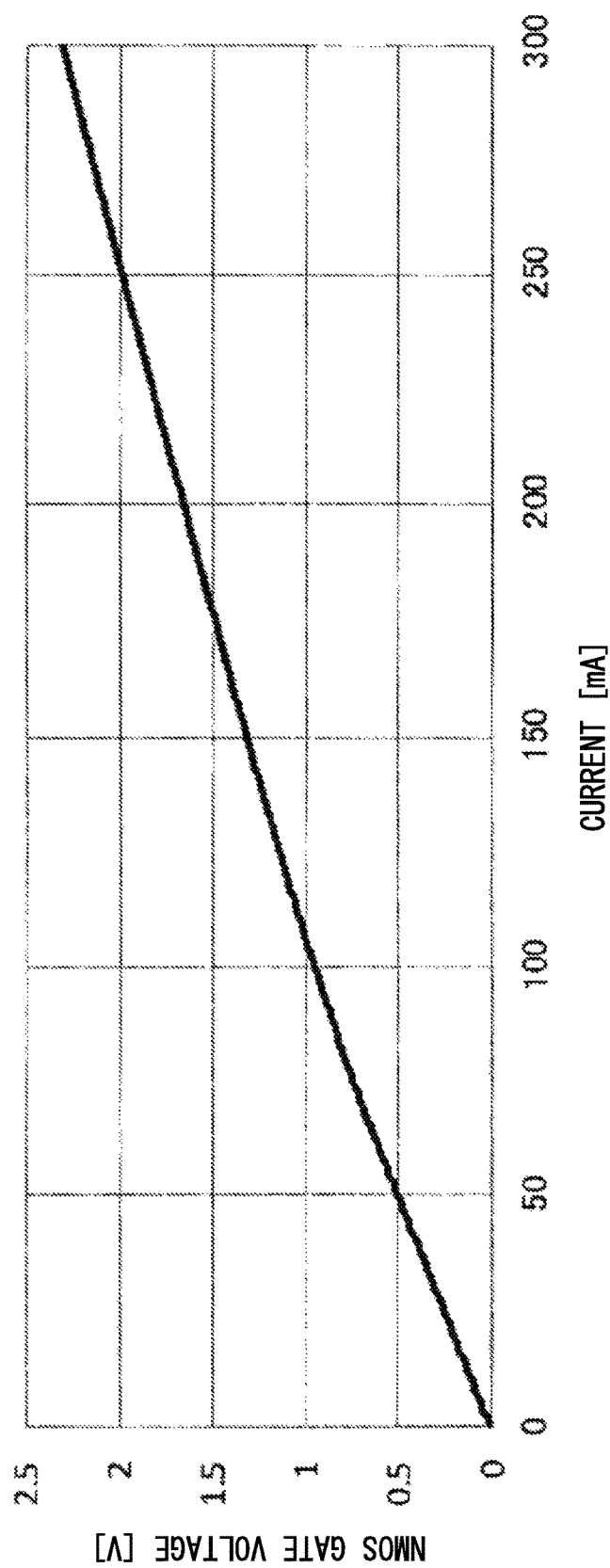
FIG. 10 shows a relationship between output current of the current output circuit 326 and gate voltage of the second heater 340.

FIG. 10 shows a relationship between output current of the current output circuit 326 and gate voltage of the second heater 340 (NMOS). Current of the current output circuit 326 is branched into the first heater 330 and the second heater 340, and the NMOS gate voltage of the second heater 340 monotonically increases as the amount of current of the current output circuit 326 increases.

Figure 11:
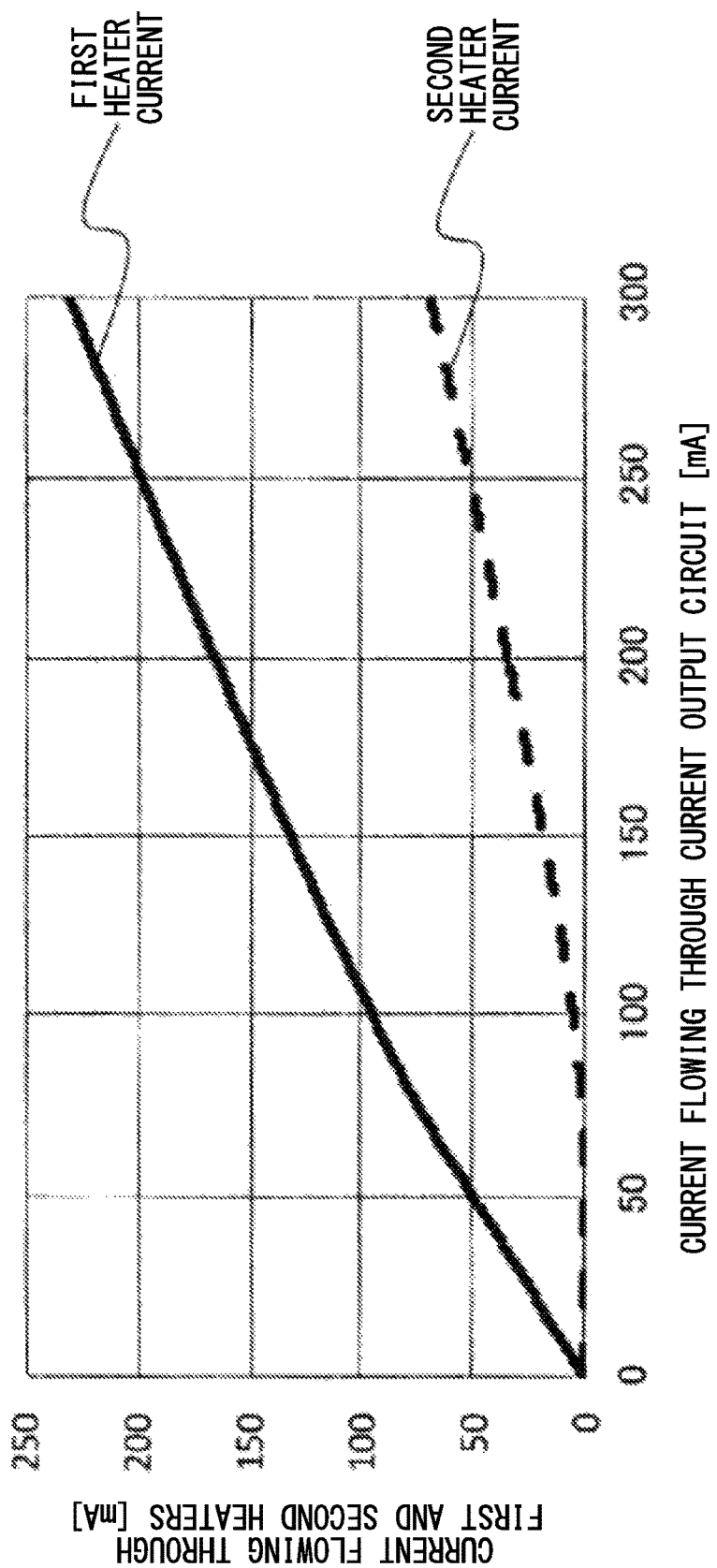
FIG. 11 shows current of the first heater 330 and current of the second heater 340 in relation to output current of the current output circuit 326.

FIG. 11 shows current of the first heater 330 and current of the second heater 340 in relation to output current of the current output circuit 326. As current of the current output circuit 326 increases, the NMOS gate voltage Vg of the second heater 340 rises, and current of the second heater 340 increases. Also, current from the current output circuit 326 is divided into current the amount of which is proportional to the square of (Vg−Vth) and which flows to the second heater 340 and the rest of the current which flows to the first heater 330. By attaining a relationship of current like the one shown in FIG. 11, the second heater 340 can make its power consumption smaller when current flows therethrough than the first heater 330 does when current flows therethrough. Thereby, with the first heater 330, it is possible to control the oscillation circuit 200 to be at a target temperature efficiently. That is, because by arranging the first heater 330 very close to an external resonator, and making the power of the first heater 330 higher than the power of the second heater 340, heat from the first heater 330 can be kept from escaping to the other portions and transferred to the external resonator, so the external resonator can be controlled to be at a target temperature.

Figure 12:
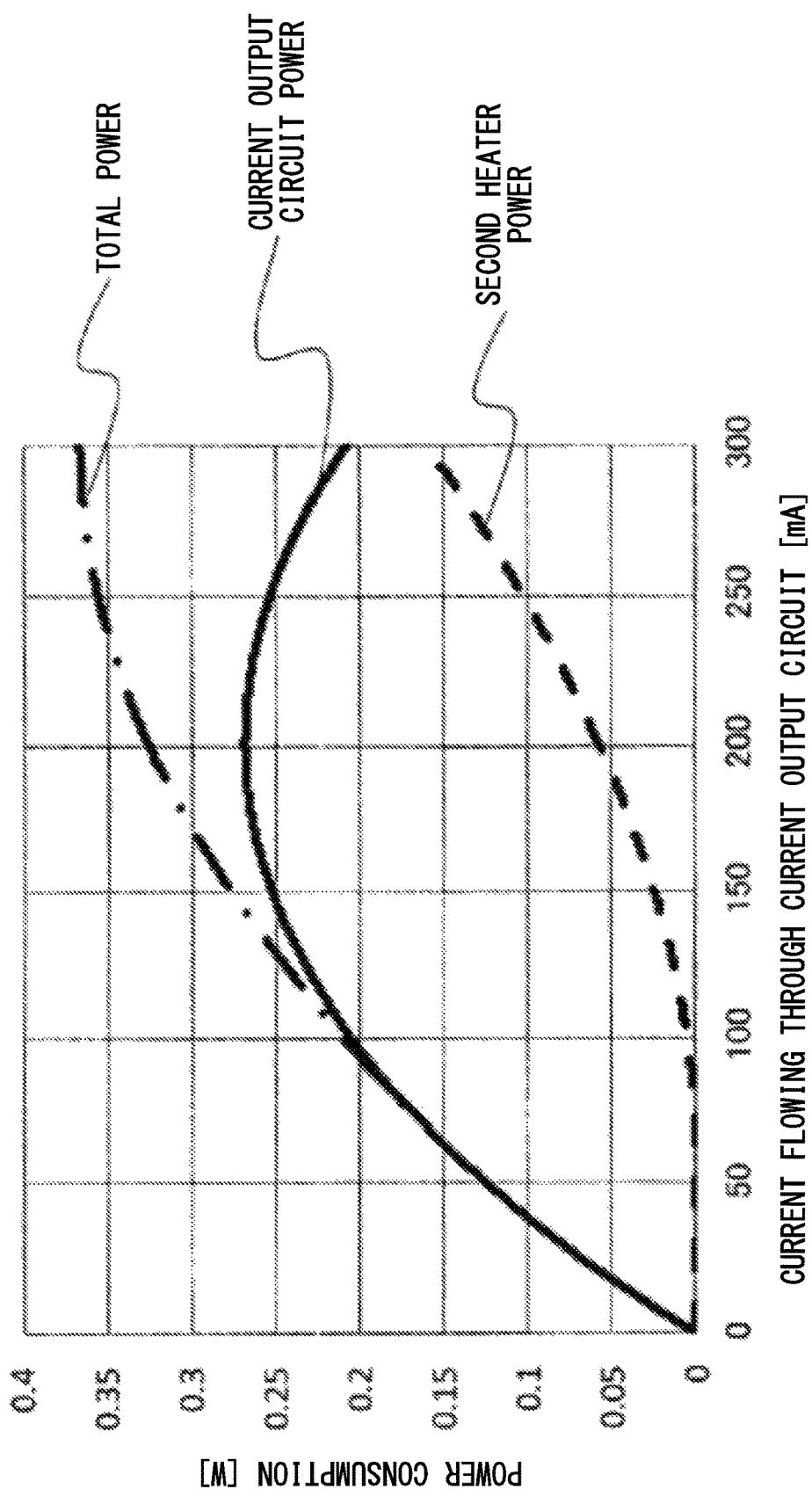
FIG. 12 shows power consumption of the current output circuit 326, power consumption of the second heater 340, and the total power of them in relation to output current of the current output circuit 326.

FIG. 12 shows power consumption of the current output circuit 326, power consumption of the second heater 340, and the total power of them in relation to output current of the current output circuit 326. Power consumption of the current output circuit 326 increases and has a positive slope at an initial period during which the amount of current is small, and shows a negative slope at the latter half (the region where ≥200 mA). On the other hand, power consumption of the second heater 340 is increasing along with increase in the amount of current of the current output circuit 326. Thereby, the total of power consumption of the current output circuit 326 and power consumption of the second heater 340 shows a positive slope over the entire region. Accordingly, in the oscillation apparatus 100 according to the present embodiment, the thermal feedback becomes stable, and thermal hunting can be prevented.

Figure 13:
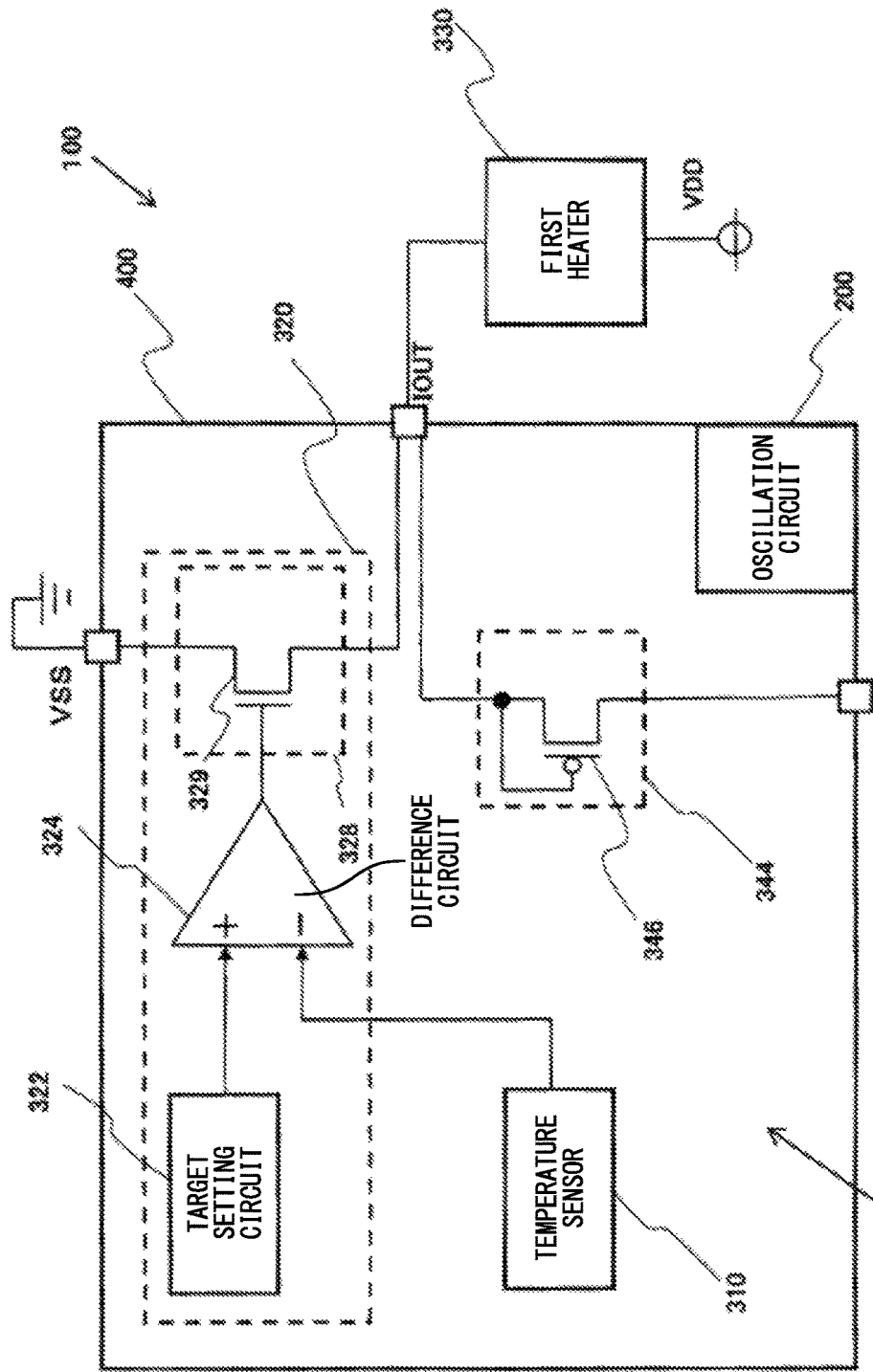
FIG. 13 shows a second configuration example of the oscillation apparatus 100 according to the present embodiment.

Next, a second configuration example of the oscillation apparatus 100 according to the present embodiment is explained. FIG. 13 shows a second configuration example of the oscillation apparatus 100 according to the present embodiment. Explanation of configurations which are approximately the same as the configurations of the oscillation apparatus 100 of the first configuration example shown in FIG. 1 is omitted. The oscillation apparatus 100 of the second configuration example is the same as the oscillation apparatus 100 of the first configuration example in terms of configurations and operation. However, a second heater 344 has a PMOS transistor 346, and the PMOS transistor 346 has the drain and source connected between an output of the current output circuit 326 and the power source potential VDD. Also, the first heater 330 is connected between an output of the current output circuit 326 and the power source potential VDD, and a current output circuit 328 has an NMOS transistor 329 having the drain and source connected between the ground potential VSS, and the first heater 330 and the second heater 344. The NMOS transistor 329 may be a bipolar transistor, a power MOSFET or a power transistor such as an IGBT.

In the oscillation apparatus 100 of the second configuration example, according to sense voltage of the temperature sensor 310, output current of the power supply circuit 320 increases, power consumption of the first heater 330 increases, voltage at the output terminal IOUT lowers, current flowing through the PMOS transistor 346 increases, and the second heater 340 generates heat. Thereby, the oscillation apparatus 100 of the second configuration example can suppress thermal hunting. Also, the oscillation apparatus 100 of the second configuration example requires no more than a solid power source pattern with a single wire allowing large current to flow through the first heater 330 and the second heater 344. As a result of this, it is possible to prevent heat from escaping, which may result in unstable heat control, as observed if extra and excessive conductivity patterns are prepared, and heat control becomes more stable.

In the oscillation apparatus 100 according to the present embodiment, values of sense voltage of the temperature sensor 310 may have a positive or negative slope in relation to temperature. The temperature sensor 310 may be connected to an input of the difference circuit 324 with the polarity thereof being switched depending on whether the temperature sensor 310 shows a positive slope or a negative slope. For example, in the oscillation apparatus 100 of the first configuration example, if the temperature sensor 310 shows a negative slope, an output of the temperature sensor 310 may be connected to a negative input of the difference circuit 324, and on the other hand, an output of the target setting circuit 322 may be connected to a positive input.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A temperature controlling apparatus comprising:
   a temperature sensor;
   a power supply circuit that supplies, to a first heater, power corresponding to a difference between a target value and a detected value obtained from the temperature sensor; and
   a second heater that is provided at a position such that thermal conduction therefrom to the temperature sensor is faster than that from the power supply circuit, and changes power consumption of the second heater according to power consumption of the power supply circuit, wherein
   the temperature sensor, the power supply circuit and the second heater are provided in a single integrated circuit, and
   the first heater is connected outside the integrated circuit.

2. An oscillation apparatus comprising:
   the temperature controlling apparatus according to claim 1; and
   an oscillation circuit controlled to be at a target temperature by the temperature controlling apparatus.

3. The temperature controlling apparatus according to claim 1, wherein if power that the power supply circuit supplies to the first heater is to be increased, the second heater consumes power to keep constant or increase a total power consumption of the power supply circuit and the second heater.

4. The temperature controlling apparatus according to claim 3, wherein if power that the power supply circuit supplies to the first heater is to be increased and power consumption of the power supply circuit is to decrease, the second heater consumes power to keep constant or increase a total power consumption of the power supply circuit and the second heater.

5. The temperature controlling apparatus according to claim 1, wherein the first heater and the second heater are connected in parallel with each other and to the power supply circuit.

6. The temperature controlling apparatus according to claim 1, wherein the second heater consumes less power when current flows therethrough than the first heater does when current flows therethrough.

7. The temperature controlling apparatus according to claim 1, wherein
   the power supply circuit has:
   a target setting circuit that outputs the target value corresponding to a target temperature;
   a difference circuit that outputs a difference between the target value and the detected value; and
   a current output circuit that outputs current corresponding to an output of the difference circuit.

8. The temperature controlling apparatus according to claim 7, wherein the first heater is connected between an output of the current output circuit and a reference potential.

9. The temperature controlling apparatus according to claim 8, wherein the second heater has a transistor that has: a drain and a source that are respectively connected between the output of the current output circuit and the reference potential; and a gate connected on a side of the output of the current output circuit.

10. The temperature controlling apparatus according to claim 9, wherein the reference potential is a ground potential.

11. The temperature controlling apparatus according to claim 9, wherein the reference potential is a power source potential.

12. The temperature controlling apparatus according to claim 1, further comprising the first heater.

* * * * *